United States Patent
DelMarco

(10) Patent No.: US 10,594,529 B1
(45) Date of Patent: Mar. 17, 2020

(54) VARIATIONAL DESIGN OF COMPANDERS FOR PAPR REDUCTION IN OFDM SYSTEMS

(71) Applicant: BAE Systems Information and Electronic Systems Integration Inc., Nashua, NH (US)

(72) Inventor: Stephen P DelMarco, N. Andover, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/106,254

(22) Filed: Aug. 21, 2018

(51) Int. Cl.
*H04L 27/26* (2006.01)
*H04L 5/00* (2006.01)

(52) U.S. Cl.
CPC ........ *H04L 27/2614* (2013.01); *H04L 5/0007* (2013.01); *H04L 27/2627* (2013.01); *H04L 27/2649* (2013.01)

(58) Field of Classification Search
CPC ............. H04L 27/2614; H04L 27/2627; H04L 5/0007; H04L 27/2649
USPC ........................................................ 375/296
See application file for complete search history.

(56) References Cited

U.S. PATENT DOCUMENTS

| | | | |
|---|---|---|---|
| 9,667,463 B2 | 5/2017 | DelMarco | |
| 2003/0212551 A1* | 11/2003 | Rose | G10L 19/24 704/230 |
| 2007/0025421 A1* | 2/2007 | Shattil | H04B 10/25752 375/136 |
| 2009/0051426 A1* | 2/2009 | Ba | H03F 1/3247 330/149 |
| 2015/0080063 A1* | 3/2015 | Sorrells | H04W 52/0209 455/574 |
| 2015/0295744 A1* | 10/2015 | DelMarco | H04L 27/2624 375/296 |
| 2016/0050096 A1* | 2/2016 | DelMarco | H04L 27/2615 375/260 |
| 2016/0295243 A1* | 10/2016 | Ashrafi | H04N 19/18 |
| 2017/0026095 A1* | 1/2017 | Ashrafi | H04B 7/0456 |
| 2017/0195054 A1* | 7/2017 | Ashrafi | H04B 10/40 |

OTHER PUBLICATIONS

Ahmad, "New distortion measures in Image Processing" sampling theory in signal and image processing. Sampling publishing vol. 4, No. 2, May 2005, pp. 151-167.*
G. Wunder, R. Fischer, H. Boche, S. Litsyn, and J.-S. No, "The PAPR Problem in OFDM Transmission," IEEE Sig. Proc. Mag., vol. 30, No. 6, pp. 130-144, Nov. 2013.
Y. Rahmatallah, and S. Mohan, "Peak-to-Average Power Ratio Reduction in OFDM Systems: A Survey and Taxonomy," IEEE Comm. Surv. and Tut., vol. 15, No. 4, pp. 1567-1592, 2013.

(Continued)

*Primary Examiner* — Juan A Torres
(74) *Attorney, Agent, or Firm* — Maine Cernota & Rardin; Scott J. Asmus

(57) ABSTRACT

A compander including a module configured to compress a range of amplitudes of a signal in accordance with a companding function derived using a calculus of variations approach and method for deriving the companding function.

17 Claims, 9 Drawing Sheets

(56) References Cited

OTHER PUBLICATIONS

X. Huang, J. Lu, J. Zheng, J. Chuang, and J Gu, "Reduction of Peak-to-Average Power Ratio of OFDM Signals with Companding Transform," Electronic Letters, vol. 37, No. 8, pp. 506-507, Apr. 2001.
X. Wang, T. T. Tjhung, and C. S. Ng, "Reduction of Peak-to-Average Power Ratio of OFDM System Using a Companding Technique," IEEE Trans. Broadcast., vol. 45, No. 3, pp. 303-307, Sep. 1999.
T. G. Pratt, N. Jones, L. Smee, and M. Torrey, "OFDM Link Performance with Companding for PAPR Reduction in the Presence of Non-linear Amplification," IEEE Trans. Broadcast., vol. 52, No. 2, pp. 261-267, Jun. 2006.
X. Wang, T. T. Tjhung, C. S. Ng, and A. A. Kassim, "On the SER Analysis of A-Law Companded OFDM System," Proc. IEEE GLOBECOM, vol. 2, pp. 756-760, 2000.
N. Ali, R. Almahainy, A. Al-Shabili, N. Almoosa, and R. Abd-Alhameed, "Analysis of Improved-Law Companding Technique for OFDM Systems," IEEE Trans. Consumer Electronics, vol. 63, No. 2, pp. 126-134, May 2017.
X. Zhang, P. Liu, J. Liu, and S. Liu, "An Advanced-Law Companding Algorithm in VLC-OFDM," Proc. IEEE Glob. Conf. on Consum. Elec., pp. 721-722, 2014.
Y. Rahmatallah, N. Bouaynaya, and S. Mohan, "Bit Error Rate Performance of Linear Companding Transforms for PAPR Reduction in OFDM Systems", Proc. IEEE GLOBECOM, pp. 1-5, 2011.
S.A. Aburakhia, E.F. Badran, and D.A.E. Mohamed, "Linear Companding Transform for the Reduction of Peak-to-Average Power Ratio of OFDM Signals", IEEE Trans. Broadcasat., col. 55, No. 1, pp. 155-160, Mar. 2009.
X. Huang, J. Lu, J. Zheng, K.B. Letaief, and J. Gu., "Companding Transform for Reduction in Peak-to-Average Power Ratio of OFDM Signals", IEEE Trans. Wireless Comm., vol. 3, No. 6, pp. 2030-2039, Nov. 2004.
C.-L. Wang, and S.-J. Ku, "A Low-Complexity Companding Transform for Paek-to-Average Power Ratio Reduction in OFDM Systems", Proc. IEEE ICASSP, vol. IV, pp. 329-332, 2006.
P. Yang, A. Hu, "Two-Piecewise Companding Transform for PAPR Reduction of OFDM Signals", Proc. 7th Int'l Conf. Wireless Comm. and Mobile Computing (IWCMC), pp. 619-623, 2011.
V. Tabatabavakili, and A. Zahedi, "Reduction in Peak-to-Average Power Ration of OFDM Signals Using a New Continuous Linear Comapnding Transform," Proc. IEEE Int'l Symp. Telecom., pp. 426-430, 2010.
M. Hu, Y. Li, W. Wang, and H. Zhang, "A Piecewise Linear Companding Transform for PAPR Reduction of OFDM Signals with Companding Distortion Mitigation," IEEE Trans. Broadcast., vol. 60, No. 3, pp. 532-539, Sep. 2014.
Y. Wang, L.-H. Wang, J.-H. Ge, and B. Ai, "Nonlinear Companding Transform Technique for Reducing PAPR of OFDM Signals," IEEE Trans. Consumer Elec., vol. 58, No. 3, pp. 752-757, Aug. 2012.
Y. Wang, J.-H. Ge, L.-H. Wang, and B. Ai, "Nonlinear Companding Transform Using Hyperbolic Tangent Function in OFDM Systems," Proc. WiCOM, pp. 1-4, 2012.
Y. Jiang, "New Companding Transform for PAPR Reduction in OFDM," IEEE Comm. Lett., vol. 14, No. 4, pp. 282-284, Apr. 2010.
T. Jiang, W. Yao, P. Guo, Y. Song, and D. Qu, "Two Novel Nonlinear Companding Schemes with Iterative Receiver to Reduce PAPR in Multi-Carrier Modulation Systems," IEEE Trans. Broadcast., vol. 52, No. 2, pp. 268-273, Jun. 2006.
T. Jiang, Y. Yang, and Y.-H Song, "Exponential Companding Technique for PAPR Reduction in OFDM Systems," IEEE Trans. Broadcast., vol. 51, No. 2, pp. 244-248, Jun. 2005.
J. Hou, J. Ge, D. Zhai, and J. Li, "Peak-to-Average Power Ratio Reduction of OFDM Signals with Nonlinear Companding Scheme," IEEE Trans. Broadcast., vol. 56, No. 2, pp. 258-262, Jun. 2010.
S.-S. Jeng, and J.-M. Chen, "Efficient PAPR Reduction in OFDM Systems Based on a Companding Technique with Trapezium Distribution," IEEE Trans. Broadcast., vol. 57, No. 2, pp. 291-298, Jun. 2011.
J. Hou, J.H. Ge, and J. Li, "Trapezoidal Companding Scheme for Peak-to-Average Power Ratio Reduction of OFDM Signals," Electronic Letters, vol. 45, No. 25, pp. 1349-1351, Dec. 2009.
Y. Wang, L.-H. Wang, J.-H. Ge, and B. Ai., "An Efficient Nonlinear Companding Transform for Reducing PAPR of OFDM Signals," IEEE Trans. Broadcast., vol. 58, No. 4, pp. 677-684, Dec. 2012.
Y. Wang, J.-H. Ge, L.-H. Wang, J. Li,and B. Ai., "Nonlinear Companding Transform for Reduction of Peak-to-Average Power Ratio in OFDM Systems," IEEE Trans. Broadcast., vol. 59, No. 2, pp. 369-375, 2013.
S. DelMarco, "General Closed-Form Family of Companders for PAPR Reduction in OFDM Signals Using Amplitude Distribution Modification," IEEE Trans. Broadcast., vol. 60, No. 1, pp. 102-109, Mar. 2014.
M. Hu, Y. Li, Y Liu, and H. Zhang, "Parameter-Adjustable Piecewise Exponential Companding Scheme for Peak-to-Average Power Ratio Reduction in Orthogonal Frequency Division Multiplexing Systems," IET Comm., vol. 8, No. 4, pp. 530-536, 2014.
S. DelMarco, "A Constrained Optimization Approach to Compander Design for OFDM PAPR Reduction," IEEE Trans. Broadcast., (Early Access) 2017.
O. Bolza, Lectures on the Calculus of Variations, 2nd ed., Chelsea Publishing Co., New York, New York, 1904.
S. Thompson, J. Proakis, and J. Zeidler, "The Effectiveness of Signal Clipping for PAPR and Total Degradation Reduction in OFDM Systems," Proc. IEEE GLOBECOM, vol. 5, pp. 2807-2811, 2005.
W. E. Boyce and R. C. DiPrima, Elementary Differential Equations, 3rd ed., John Wiley & Sons, New York, New York, 1977.
T. Jiang, W. Xiang, P. C. Richardson, D. Qu, and G. Zhu, "On the Nonlinear Companding Transform for Reduction in PAPR of MCM Signals," IEEE Trans. Wireless Comm., vol. 6, No. 6, pp. 2017-2021, Jun. 2007.
Ahmad et al. "New Distortion Measures in Image Processing", Sampling Theory in Signal and Image Processing. Sampling publishing vol. 4, No. 2, May 2005, pp. 151-167.
International Search Report, PCT/US2019/046862. dated Sep. 16, 2019, 9 pages.

* cited by examiner

VARIATIONAL DESIGN OF COMPANDERS FOR PAPR REDUCTION IN OFDM SYSTEMS

FIELD

The disclosure relates to Orthogonal Frequency Division Multiplexing (OFDM) systems, and more particularly, to companders used in Orthogonal Frequency Division Multiplexing (OFDM) systems.

BACKGROUND

Orthogonal Frequency Division Multiplexing (OFDM), a method of encoding digital data on multiple carrier frequencies, is commonly used for multi-carrier modulation and has found use in applications such as digital television and audio broadcasting, DSL internet access, wireless networks, power line networks, and 4G mobile communications. Over the years, OFDM has become a standard for wireless communications.

OFDM systems use numerous, closely-spaced, orthogonal sub-carrier signals with overlapping spectra to carry data, with modulation based on Fast Fourier Transform algorithms. OFDM systems use these multiple subcarriers to transmit multiple symbols simultaneously. Where multiplexing is desired or required, OFDM provides several advantages over competing technologies, including a resistance to narrowband fading and relatively high information transmission rates.

OFDM systems, however, have inherently high peak-to-average power ratios (PAPRs), which is caused by constructive interference of sub-tones. More specifically, by the central limit theorem, the addition of many subcarriers produces a Gaussian distributed signal and a corresponding Rayleigh-distributed signal amplitude distribution. The long tail of the Rayleigh amplitude distribution causes power amplifier saturation, which induces signal distortion and degrades demodulation performance at the receiver, thereby reducing the effectiveness and efficiency of the communications system.

Over the years, many approaches have been developed to mitigate the PAPR problem. Among these approaches, companding offers a computationally-efficient, simple, and effective solution. Companding involves reducing the dynamic range of a signal using a compander. Companders used in OFDM applications are weighting functions that modify an OFDM signal amplitude to reduce the large values resulting from multi-tone constructive interference. Companders simultaneously keep the average power constant by upweighting smaller amplitude values, thereby reducing the PAPR.

Early solutions used companders adapted from audio and speech processing, including μ-law and A-law companders, which have recently been extended to provide better performance. Subsequently, companders were developed by directly modifying the signal amplitude, by using, for example, piecewise linear components, hyperbolic functions, and Airy functions. More recently, compander design has been performed by transforming part or all of the Rayleigh amplitude distribution into a form that is more favorable. These approaches include transformation into a uniform distribution, trapezoidal, linear, inverse square-root, or exponential.

Most recently, compander design has included the use of piecewise linear components, using a constrained optimization approach, to optimally capture the Rayleigh probability density function. These designs demonstrate significantly improved out-of-band power rejection, while simultaneously providing equivalent demodulation performance, at the cost of reduced PAPR reduction performance.

What is needed, therefore, is a more generalized version of the constrained optimization approach described above that alleviates assumptions on the parametric form of the approximating function, thereby providing additional flexibility for compander design, which may be taken advantage of to provide one or all of enhanced PAPR performance (i.e. a reduced PAPR), reduced out-of-band power, and/or improved demodulation performance.

SUMMARY

Companders are weighting functions that modify the OFDM signal amplitude to reduce the large values resulting from multi-tone constructive interference. Companders simultaneously keep the average power constant by, by upweighting smaller amplitude values, thereby reducing the PAPR. The present disclosure defines and solves a constrained variational problem for optimal compander design. Embodiments of the resulting compander solution demonstrate performance advantages over current, state-of-the-art companders.

In addition to those uses described elsewhere herein, embodiments of the compander disclosed herein may also be useful in data compression applications where data exhibits large dynamic range. One such application is compression of seismic signals, e.g. well-logging data, where signal amplitudes vary by orders of magnitude. The teachings provided herein may also prove useful in speech and audio compression applications, where early companders were used for dynamic range compression.

One embodiment of the present disclosure provides a compander, the compander comprising: a module configured to compress a range of amplitudes of a signal in accordance with a companding function derived using a calculus of variations approach, wherein the companding function is derived from:

$$I(g) = \int_0^A [f_R(x) - g(x)]^2 + [f'_R(x) - g'(x)]^2 dx.$$

Another embodiment of the present disclosure provides such a compander further comprising a corresponding decompander, the decompander comprising a module configured to expand a companded signal in accordance with a decompanding function, wherein the decompanding function is determined numerically as an inversion of the companding function.

A further embodiment of the present disclosure provides such a compander wherein the companding function includes a smoothness condition.

Yet another embodiment of the present disclosure provides such a compander wherein the compander is configured to compand orthogonal frequency division multiplexed signals.

A yet further embodiment of the present disclosure provides such a compander wherein the companding function is subject to a unity cumulative distribution function constraint.

Still another embodiment of the present disclosure provides such a compander wherein the unity cumulative distribution function constraint is $$\int_0^A g(x)dx = 1.$$

A still further embodiment of the present disclosure provides such a compander wherein the companding function is subject to a constant power constraint.

Even another embodiment of the present disclosure provides such a compander wherein the unity constant power constraint is $$\int_0^A x^2 g(x)dx = \int_0^\infty x^2 f_R(x)dx = \sigma^2.$$

An even further embodiment of the present disclosure provides such a compander wherein A denotes a signal amplitude cutoff value.

One embodiment of the present disclosure provides a method of companding, the method comprising: deriving a companding function using a calculus of variations approach; and programming a compander comprising a module configured to compress a range of amplitudes of a signal to compress the signal in accordance with the derived companding function.

Another embodiment of the present disclosure provides such a method of companding further comprising a method of decompanding, wherein the method of decompanding comprises programming a decompander comprising a module configured to expand a range of amplitudes of a signal to expand the signal in accordance with a derived decompanding function, wherein the decompanding function is determined numerically as an inversion of the companding function.

A further embodiment of the present disclosure provides such a method of companding, wherein the companding function is derived from:

$$y = -\left(\frac{\lambda_2}{2}\right)x^2 - \left(\lambda_2 + \frac{\lambda_1}{2}\right) + \frac{2x}{\sigma^2}e^{-\frac{x^2}{\sigma^2}} + De^{-x}.$$

Yet another embodiment of the present disclosure provides such a method of companding, wherein the companding function is derived from:

$$I(g) = \int_0^A [f_R(x) - g(x)]^2 + [f'_R(x) - g'(x)]^2 dx.$$

A yet further embodiment of the present disclosure provides such a method of companding, wherein companding function includes a smoothness condition.

Still another embodiment of the present disclosure provides such a method of companding, wherein the compander is configured to compand orthogonal frequency division multiplexed signals.

A still further embodiment of the present disclosure provides such a method of companding wherein the companding function is subject to a unity cumulative distribution function constraint.

Even another embodiment of the present disclosure provides such a method of companding wherein the unity cumulative distribution function constraint is $$\int_0^A g(x)dx = 1.$$

An even further embodiment of the present disclosure provides such a method of companding wherein the companding function is subject to a constant power constraint.

A still even another embodiment of the present disclosure provides such a method of companding wherein the unity constant power constraint is $$\int_0^A x^2 g(x)dx = \int_0^\infty x^2 f_R(x)dx = \sigma^2.$$

A still even further embodiment of the present disclosure provides such a method of companding wherein A denotes a signal amplitude cutoff value.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

By defining and solving a constrained variational problem to optimally match an original Rayleigh distribution function, assumptions on parametric compander form are alleviated, providing additional flexibility for compander design. Furthermore, by more stringently matching the Rayleigh distribution of an original signal, in embodiments through the inclusion of a smoothness condition, higher performing companders are produced.

Embodiments of the compander disclosed herein are shown to provide a significant improvement in demodulation performance over current state-of-the-art companders, while also providing improvements in out-of-band power rejection performance.

Figure 1:
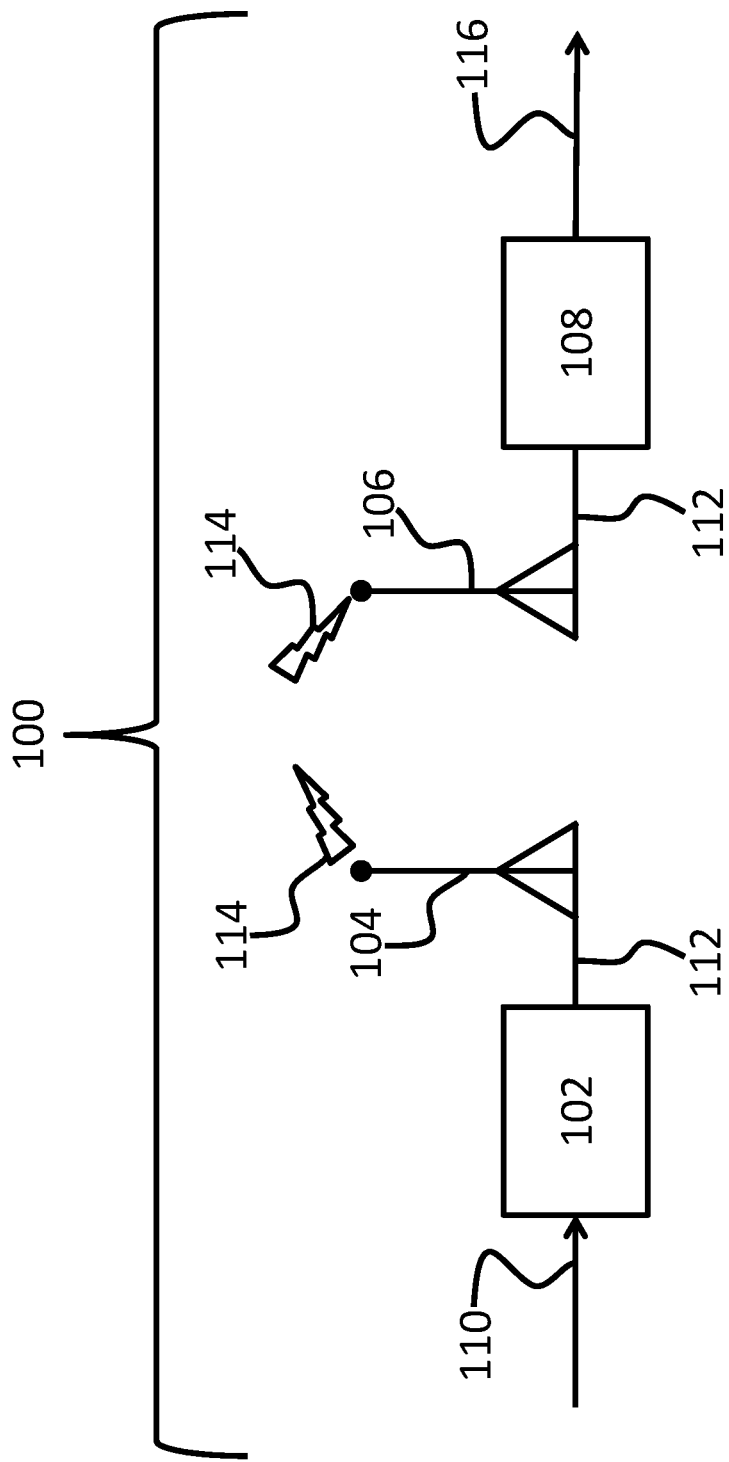
FIG. 1 is a schematic illustrating a system that compands and decompands signals based on the approaches disclosed herein

Now referring to FIG. 1, a system for transmitting a companded signal and receiving a decompanded signal is shown, in accordance with embodiments of the present disclosure. The system 100 includes a companding processor 102, a transmitting antenna 104, a receiving antenna 106 and a decompanding processor 108.

"Processor" and "Logic", as used herein, include but are not limited to hardware, firmware, software and/or combinations of each to perform a function(s) or an action(s), and/or to cause a function or action from another logic, method, and/or system. For example, based on a desired application or needs, logic and/or processor may include a software controlled microprocessor, discrete logic, an application specific integrated circuit (ASIC), a programmed logic device, a memory device containing instructions, or the like. Logic and/or processor may include one or more gates, combinations of gates, or other circuit components. Logic and/or a processor may also be fully embodied as software. Where multiple logics and/or processors are described, it may be possible to incorporate the multiple logics and/or processors into one physical logical apparatus (or processor). Similarly, where a single logic and/or processor is described, it may be possible to distribute that single logic and/or processor between multiple physical logics and/or processors.

In FIG. 1, the companding processor 102 compands input signals 110 into companded signals 112 using compander functions described herein; the compander function compands the input signals 110. The transmitter transmits the companded signals 112 as electromagnetic wave signals 114 through the transmit antenna 104. The receiver antenna 106 receives the electromagnetic wave signals representing the companded signals 114. The decompanding processor 108 then decompands the companded signals 112 according to a decompanding function disclosed herein to generate decompanded output signals 116.

Figure 2:
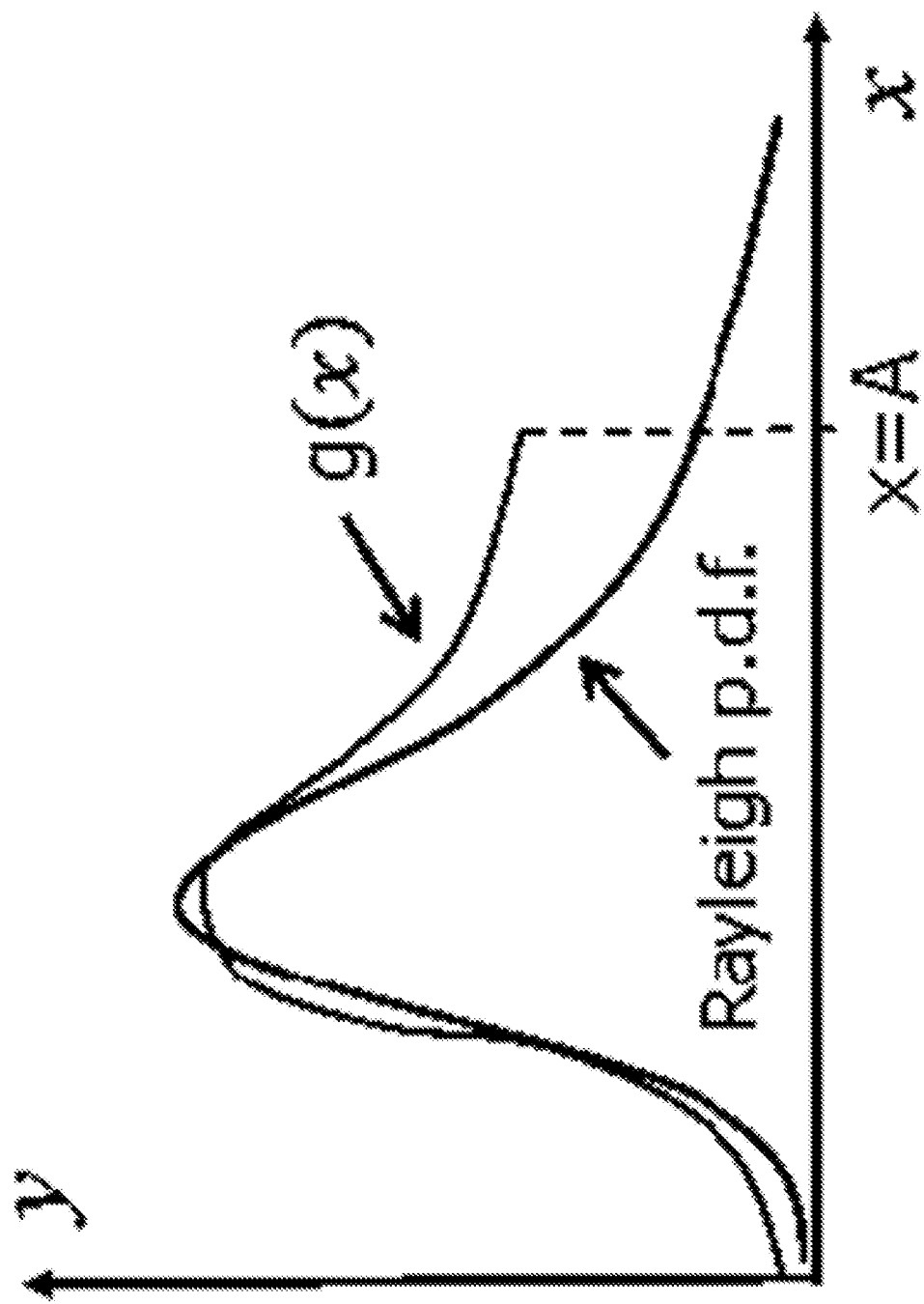
FIG. 2 is a chart describing an approximation to a Rayleigh probability density function, in accordance with embodiments of the present disclosure.

Now referring to FIG. 2, a function g(x) attempts to match the Rayleigh probability density function, $f(x)$, and its first derivative, as closely as possible over the region of definition [0,A]. Here, A denotes the cutoff value; i.e., the limiting value of the signal amplitude. The function g(x) is a probability density function, therefore g(x)≥0.

The argument for such an effort is based on the assumption that minimal perturbation of the original Rayleigh probability density function will provide companders that minimally distort the companded signal. Minimal signal distortion reduces demodulation errors and spectral regrowth problems, while simultaneously reducing PAPR. This assumption was demonstrated to be true by using a set of piecewise linear components to optimally approximate the Rayleigh probability density function.

Including the derivative term in the minimization problem serves two purposes. First, it provides an added matching criterion, a smoothness criterion, which enables a closer match to the properties of the original Rayleigh distribution. Second, it mitigates the potential problem that the solution g(x) might have negative values over a portion of its region of definition, particularly near the initial endpoint of the domain of definition, i.e. for x∈[0,E] for ε<<A. Since g(x) is a probability density function, it must have non-negative values. Incorporation of the derivative term discourages negative solution values because, as seen from equation 5, below, the derivative of the Rayleigh distribution at x=0 is positive. Hence, the derivative term encourages the solution to be initially increasing. Therefore, if we impose a non-negative initial condition on the solution, then the solution will tend to increase, avoiding negative values.

Because g(x) is a probability density function, g(x) integrates to a unity value, as shown in equation 1, which is produced below:

$$\int_0^A g(x)dx = 1.\qquad\text{Equation 1}$$

Equation 1 is the unity cumulative distribution function (c.d.f) constraint. Also, g(x), to preserve the average power, $\sigma^2$, of the original Rayleigh distributed signal, must satisfy equation 2, which is produced below:

$$\int_0^A x^2 g(x)dx = \int_0^\infty x^2 f_R(x)dx = \sigma^2.\qquad\text{Equation 2}$$

Equation 2 is a constant power constraint. To find g(x), minimize the square of a Sobolev norm, i.e., minimize the integral, as shown in equation 3, which is produced below:

$$I(g) = \int_0^A [f_R(x) - g(x)]^2 + [f_R'(x) - g'(x)]^2 dx.\qquad\text{Equation 3}$$

Equation 3 is subject to the constraints of equations 1 and 2. The minimization of I in equation 3 is a minimization of a functional, over a space of functions g∈C²([0,A]), the space of twice continuously-differentiable functions.

The Rayleigh probability density function (p.d.f.) is given by equation 4, which is produced below:

$$f_R(x) = \frac{2x}{\sigma^2} e^{-\frac{x^2}{\sigma^2}}.\qquad\text{Equation 4}$$

The first derivative of equation 4 is shown in equation 5, which is produced below:

$$f_R'(x) = \left(\frac{2\sigma^2 - 4x^2}{\sigma^4}\right) e^{-\frac{x^2}{\sigma^2}}.\qquad\text{Equation 5}$$

Substituting equations 4 and 5 into equation 3 provides equation 6, which is produced below:

$$I(g) = \qquad\text{Equation 6}$$
$$\int_0^A \left[\left(\frac{2x}{\sigma^2}\right)e^{-\frac{x^2}{\sigma^2}} - g(x)\right]^2 + \left[\left(\frac{2\sigma^2 - 4x^2}{\sigma^4}\right)e^{-\frac{x^2}{\sigma^2}} - g'(x)\right]^2 dx.$$

As discussed above, inclusion of the derivative in equation 6 imposes a smoothness condition on the solution g(x) that mitigates the non-negativity of the solution. This enables simplification of the optimization problem by foregoing an explicit enforcement of the non-negativity condition.

The constrained variational problem then becomes: minimize equation 6 for function g(x) subject to the unity c.d.f constraint of equation 1 and the constant power constraint of equation 2. In embodiments, the problem is solved using techniques from the Calculus of Variations, together with Lagrange multipliers.

To use traditional Calculus of Variations terminology, let y=g(x). Then the minimization problem becomes, minimize:

$$I(y) = \int_0^A \left[\left(\frac{2x}{\sigma^2}\right)e^{-\frac{x^2}{\sigma^2}} - y\right]^2 + \left[\left(\frac{2\sigma^2 - 4x^2}{\sigma^4}\right)e^{-\frac{x^2}{\sigma^2}} - y'\right]^2 dx. \qquad \text{Equation 7}$$

Subject to:

$$\int_0^A y\,dx = 1. \qquad \text{Equation 8}$$

and:

$$\int_0^A x^2 y\,dx = \sigma^2. \qquad \text{Equation 9}$$

The below equations derive the solution of embodiments of the present disclosure:

First, we define:

$$F(x, y, y') = \left[\left(\frac{2x}{\sigma^2}\right)e^{-\frac{x^2}{\sigma^2}} - y\right]^2 + \left[\left(\frac{2\sigma^2 - 4x^2}{\sigma^4}\right)e^{-\frac{x^2}{\sigma^2}} - y'\right]^2; \qquad \text{Equation 10a}$$

$$G_1(x, y, y') = y; \text{ and} \qquad \text{Equation 10b}$$

$$G_2(x, y, y') = x^2 y. \qquad \text{Equation 10c}$$

For Lagrange multipliers $\lambda_1$, $\lambda_2$, the Lagrangian, for which the critical point is determined as part of the solution mechanization, is:

$$\Lambda = \int_0^A F + \lambda_1 G_1 + \lambda_2 G_2 \, dx. \qquad \text{Equation 10d}$$

The integrand in equation 10d is denoted by:

$$\Phi(x, y, y') = \left[\left(\frac{2x}{\sigma^2}\right)e^{-\frac{x^2}{\sigma^2}} - y\right]^2 + \left[\left(\frac{2\sigma^2 - 4x^2}{\sigma^4}\right)e^{-\frac{x^2}{\sigma^2}} - y'\right]^2 + \lambda_1 y + \lambda_2 x^2 y. \qquad \text{Equation 11}$$

In embodiments, a condition for the minimization of equation 7, subject to equations 8 and 9, is that $\Phi$ satisfies the Euler-Lagrange equation produced below:

$$\frac{\partial \Phi}{\partial y} - \frac{d}{dx}\left(\frac{\partial \Phi}{\partial y'}\right) = 0. \qquad \text{Equation 12}$$

Satisfaction of the Euler-Lagrange equation is a necessary condition, but not a sufficient condition for finding an extremal in equation 7. Sufficiency is difficult to prove, so often the solution to the Euler-Lagrange equation is taken as a candidate solution to the optimization problem. Performance of the candidate solution is then evaluated to determine if it provides a performance improvement.

Carrying out the differentiations indicated in equation 12 and simplifying gives equations 13, 14, and 15, which are produced below:

$$\frac{\partial \Phi}{\partial y} = -2\left[\left(\frac{2x}{\sigma^2}\right)e^{-\frac{x^2}{\sigma^2}} - y\right] + \lambda_1 + \lambda_2 x^2. \qquad \text{Equation 13}$$

$$\frac{\partial \Phi}{\partial y'} = -2\left[\left(\frac{2\sigma^2 - 4x^2}{\sigma^4}\right)e^{-\frac{x^2}{\sigma^2}} - y'\right]. \qquad \text{Equation 14}$$

$$\frac{d}{dx}\left(\frac{\partial \Phi}{\partial y'}\right) = 2y'' - \frac{8}{\sigma^4}\left(-3x + \frac{2}{\sigma^2}x^3\right)e^{-\frac{x^2}{\sigma^2}}. \qquad \text{Equation 15}$$

Substituting equations 13, 14, and 15 into equation 12 produces a second order differential equation, equation 16, which is produced below:

$$y'' - y = \frac{\lambda_1}{2} + \frac{\lambda_2 x^2}{2} + \frac{4}{\sigma^2}\left(-\left[3 + \frac{\sigma^2}{2}\right]x + \frac{2}{\sigma^2}x^3\right)e^{-\frac{x^2}{\sigma^2}}. \qquad \text{Equation 16}$$

Because equation 16 is linear, the individual inhomogenous components may be solved for separately and the solutions superimposed to obtain the solution to the full inhomogenous equation. Using the method of undetermined coefficients, the solutions for the Lagrange multipliers may be found as:

$$y = -\frac{\lambda_1}{2} \qquad \text{Equation 17}$$

which solves:

$$y'' - y = -\frac{\lambda_1}{2} \qquad \text{Equation 18}$$

and:

$$y = -\left(\frac{\lambda_2}{2}\right)x^2 - \lambda_2 \qquad \text{Equation 19}$$

which solves:

$$y'' - y = \left(\frac{\lambda_2}{2}\right)x^2. \qquad \text{Equation 20}$$

Regarding the remaining inhomogenous term, the following equation, equation 21, should be considered:

$$y'' - y = \frac{4}{\sigma^2}\left(-\left[3 + \frac{\sigma^2}{2}\right]x + \frac{2}{\sigma^2}x^3\right)e^{-\frac{x^2}{\sigma^2}}.$$  Equation 21

To solve equation 21, consider equation 16 without the Lagrange multipliers, i.e., consider the minimization problem without the constraints. Without the constraints, the Rayleigh p.d.f. is the solution to minimizing equation 3, i.e. $g(x) = f_R(x)$, because then I=0, which is the minimum value that I can take. Thus, equation 22, produced below, solves equation 21, shown above:

$$y = \frac{2x}{\sigma^2}e^{-\frac{x^2}{\sigma^2}}.$$  Equation 22

This solution can be verified directly by substituting equation 22 into equation 21.

To complete the solution of equation 16, the solution to the homogenous equation is obtained. The solution to the homogenous form of equation 16 is shown in equation 23, produced below:

$$y = De^x$$  Equation 23 for initial condition $y(0)=D$.

The complete solution to equation 16 is then provided by equation 24, produced below:

$$y = -\left(\frac{\lambda_2}{2}\right)x^2 - \left(\lambda_2 + \frac{\lambda_1}{2}\right) + \frac{2x}{\sigma^2}e^{-\frac{x^2}{\sigma^2}} + De^{-x}.$$  Equation 24

The solution of equation 24 has three unknowns: two Lagrange multipliers and the initial condition. These unknowns may be determined from the imposed initial condition and the two constraints shown in equations 8 and 9.

Consider the constraint of equation 8. Now substitute the general solution of equation 24 into equation 8 to get equation 25, shown below:

$$\int_0^A -\left(\frac{\lambda_2}{2}\right)x^2 - \left(\lambda_2 + \frac{\lambda_1}{2}\right) + \frac{2x}{\sigma^2}e^{-\frac{x^2}{\sigma^2}} + De^{-x}dx = 1.$$  Equation 25

The integral shown in equation 25 can be evaluated in closed form. Carrying out the integration and simplifying produces equation 26, shown below:

$$-\left(\frac{A^3}{6} + A\right)\lambda_2 - \left(\frac{A}{2}\right)\lambda_1 + D(1 - e^{-A}) = 1 - e^{-\frac{A^2}{\sigma^2}}.$$  Equation 26

Similarly, the substitution of equation 24 into equation 9 provides equation 27, shown below:

$$\int_0^A x^2\left[-\left(\frac{\lambda_2}{2}\right)x^2 - \left(\lambda_2 + \frac{\lambda_1}{2}\right) + \frac{2x}{\sigma^2}e^{-\frac{x^2}{\sigma^2}} + De^{-x}\right]dx = \sigma^2$$  Equation 27 which, after performing integration and simplification, produces equation 28, shown below:

$$-\left(\frac{A^5}{10} + \frac{A^3}{3}\right)\lambda_2 - \left(\frac{A^3}{6}\right)\lambda_1 +$$
$$D(-A^2e^{-A} - 2Ae^{-A} - 2e^{-A} + 2) = \sigma^2 - \int_0^A \frac{2x^3}{\sigma^2}e^{-\frac{x^2}{\sigma^2}}dx$$  Equation 28

Equations 26 and 28 provide two equations in the two unknown Lagrange multipliers. To solve these simultaneously, the pair may be re-expressed as equations 29 and 30, then as equations 31 and 32, which are provided below:

$$-\left(\frac{A^3}{6} + A\right)\lambda_2 - \left(\frac{A}{2}\right)\lambda_1 = B_1 - D\gamma_1; \text{ and}$$  Equation 29

$$-\left(\frac{A^5}{10} + \frac{A^3}{3}\right)\lambda_2 - \left(\frac{A^3}{6}\right)\lambda_1 = B_2 - D\gamma_2$$  Equation 30 for $$B_1 = 1 - \int_0^A \frac{2x}{\sigma^2}e^{-\frac{x^2}{\sigma^2}}dx = e^{-\frac{A^2}{\sigma^2}};$$  Equation 31

$$B_2 = \sigma^2 - \int_0^A \frac{2x^3}{\sigma^2}e^{-\frac{x^2}{\sigma^2}}dx =$$
$$\sigma^2 - \left[-\frac{\sigma^2}{2}Ae^{-\frac{A^2}{\sigma^2}} + \frac{\sigma^3\sqrt{\pi}}{4}\text{erf}\left(\frac{A}{\sigma}\right)\right];$$  Equation 32

$$\gamma_1 = (1 - e^{-A});$$  Equation 33

$$\gamma_2 = (-A^2e^{-A} - 2Ae^{-A} - 2e^{-A} + 2); \text{ and}$$  Equation 34

$$\text{erf}(x) = \frac{2}{\sqrt{\pi}}\int_0^x e^{-\xi^2}d\xi.$$  Equation 35

Solving equations 29 and 30 simultaneously, after simplification, produces equations 36 and 37, shown below:

$$\lambda_1 = \xi_1 D + \xi_2$$  Equation 36

$$\lambda_2 = \delta_1 D + \delta_2$$  Equation 37

The parameters in equations 36 and 37 are provided in equations 38, 39, 40, and 41, which are shown below:

$$\delta_1 = \frac{\gamma_2 - \frac{A^2\gamma_1}{3}}{\frac{A^5}{10} - \frac{A^5}{18}};$$  Equation 38

$$\delta_2 = \frac{\frac{A^2 B_1}{3} - B_2}{\frac{A^5}{10} - \frac{A^5}{18}};$$  Equation 39

$$\xi_1 = \frac{\left(\frac{A^5}{10} + \frac{A^3}{3}\right)\delta_1 - \gamma_2}{\frac{-A^3}{6}}; \text{ and}$$  Equation 40

$$\xi_2 = \frac{B_2 + \left(\frac{A^5}{10} + \frac{A^3}{3}\right)\delta_2}{\frac{-A^3}{6}}.$$  Equation 41

Substituting equations 36 and 37 into equation 24 and simplifying produces equation 42, shown below:

$$y = \left(-\frac{\delta_1 x^2}{2} - \delta_1 - \frac{\xi_1}{2} + e^{-x}\right)D + \left(\frac{2x}{\sigma^2}e^{-\frac{x^2}{\sigma^2}} - \frac{\delta_2 x^2}{2} - \delta_2 - \frac{\xi_2}{2}\right)$$

Equation 42

Given equation 42, it remains to impose the initial condition. In equation 43, shown below, equation 43 is solved for the initial condition, at x=0.

$$y(0) = \left(-\delta_1 - \frac{\xi_1}{2} + 1\right)D + \left(-\delta_2 - \frac{\xi_2}{2}\right)$$

Equation 43

Equation 43 then implies equation 44, shown below.

$$D = \frac{y(0) + \delta_2 + \frac{\xi_2}{2}}{-\delta_1 - \frac{\xi_1}{2} + 1}$$

Equation 44

To summarize, the solution to equation 7, subject to equations 8 and 9, is given by equation 24 for Lagrange multiplier values given by equations 36 and 37, using equations 38 through 41 and 44, for imposed initial condition y(0).

We denote the compander by C, which operates on an input signal x(n) to adjust the signal amplitude. The output, companded signal is y(n)=C{x(n)}. Because the compander is monotonic over its domain, the compander can be determined from equation 45, which is shown below:

$$C\{x(n)\} = \text{sgn}\{x(n)\} F_{|y|}^{-1} F_{|x|}\{x(n)\}$$

Equation 45

Here, $F_{|x|}$ is the c.d.f. of the input signal and $F_{|y|}$ is the c.d.f. of the companded output signal. The c.d.f. $F_{|x|}$ is the Rayleigh c.d.f.

$$F_{|x|}(x) = 1 - e^{-\frac{x^2}{\sigma^2}}.$$

The p.d.f. corresponding to the c.d.f. $F_{|y|}$ is given by equation 46, shown below:

$$y = -\left(\frac{\lambda_2}{2}\right)x^2 - \left(\lambda_2 + \frac{\lambda_1}{2}\right) + \frac{2x}{\sigma^2}e^{-\frac{x^2}{\sigma^2}} + De^{-x}$$

Equation 46

Integration of equation 46 then produces the c.d.f., which is shown in equation 47, below:

$$F_{|y|}(x) = \int_0^x -\left(\frac{\lambda_2}{2}\right)\xi^2 - \left(\lambda_2 + \frac{\lambda_1}{2}\right) + \frac{2\xi}{\sigma^2}e^{-\frac{\xi^2}{\sigma^2}} + De^{-\xi} d\xi$$

Equation 47

After integrating and simplifying equation 47, we are left with equation 48, shown below:

$$F_{|y|}(x) = -\left(\frac{\lambda_2}{6}\right)x^3 - \left(\lambda_2 + \frac{\lambda_1}{2}\right)x + D(1 - e^{-x}) + 1 - e^{-\frac{x^2}{\sigma^2}}$$

Equation 48

Now regarding numerical results of the above equations, as a preliminary matter, inversion of the c.d.f. in equation 48, in embodiments, is done numerically. Similarly, the decompander, in embodiments, is determined numerically as an inversion of the compander.

For performance demonstration, numerical results were generated for OFDM signals with 64 subcarriers using Quadrature Phase Shift Keying (QPSK) modulation over an additive Gaussian white noise channel, in accordance with embodiments of the present disclosure. An oversampling factor of four was used during testing to ensure that the PAPR of the discrete signals adequately approximates the PAPR from continuous signals. The Rayleigh distribution mean power square root was chosen as $\sigma=1.0$ to generate unit power signals. Monte-Carlo runs were performed over ten thousand realizations of signal-plus-noise for each noise level. PAPR reduction performance was measured by the complimentary cumulative distribution function (CCDF), which gives the probability that the PAPR value surpasses a threshold: CCDF=(PAPR>PAPR$_0$). Compander effect on demodulation performance was measured by symbol error rate (SER). Compander effect on out-of-band power rejection was quantified from power spectrums.

To verify robustness of performance across different operating conditions, performance results were also generated for 128 and 256 subcarriers and for different power amplifier saturation values. Results across these parameter variations verify the results obtained from the 64 carrier case, and the chosen power amplifier saturation value given below.

Performance results of the Variational compander (VAR), disclosed herein demonstrated that it provides improved performance over current state-of-the-art companders in terms of superior out-of-band power rejection.

Two cutoff values were chosen to demonstrate the performance of the VAR over different parameter regions; a larger cutoff value, A=2.1213, and a smaller cutoff value, A=1.8. The variational solutions (x) for each compander cutoff value together with the Rayleigh p.d.f, for comparison, are shown in FIG. 2.

Figure 3:
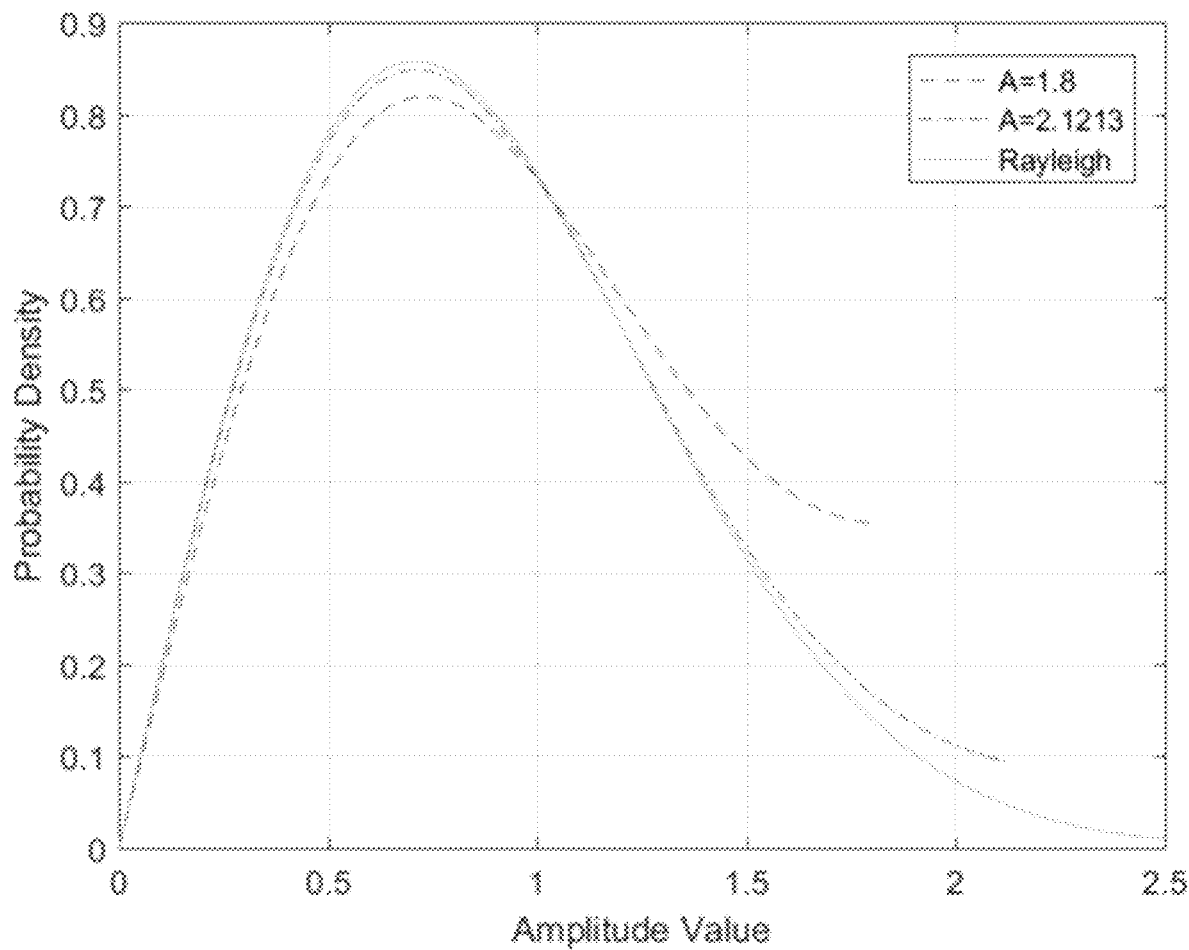
FIG. 3 is a chart describing variational solutions for two cutoff values together with a Rayleigh distribution, in accordance with embodiments of the present disclosure.

FIG. 3 shows that the variational solutions closely match the Rayleigh distribution shape. As the cutoff value increases, the variational solution approaches the baseline Rayleigh distribution. The variational solutions for smaller cutoff values show larger deviation from the Rayleigh distribution, which is necessary for meeting the unity c.d.f. and constant power constraints.

Performance results were generated using a nonlinear, zero-phase power amplifier model in the processing chain. Use of the power amplifier simulates effects of power amplifier saturation on performance. The zero-phase power amplifier only affects the output power level, and produces the output signal level as a function of the input signal level as shown in equation 49, shown below:

$$y_{|OUT|} = \frac{a y_{|IN|}}{\left[1 + \left(\frac{|y_{|IN|}|}{A_{SAT}}\right)^{2p}\right]^{\frac{1}{2p}}}$$

Equation 49 for chosen values of gain a=1.0, saturation $A_{SAT}$=3.0, and nonlinearity p=2.0.

For the larger cutoff value, A=2.1213, the VAR provides performance comparable to, if not slightly better than, current state-of-the-art companders.

Figure 4:
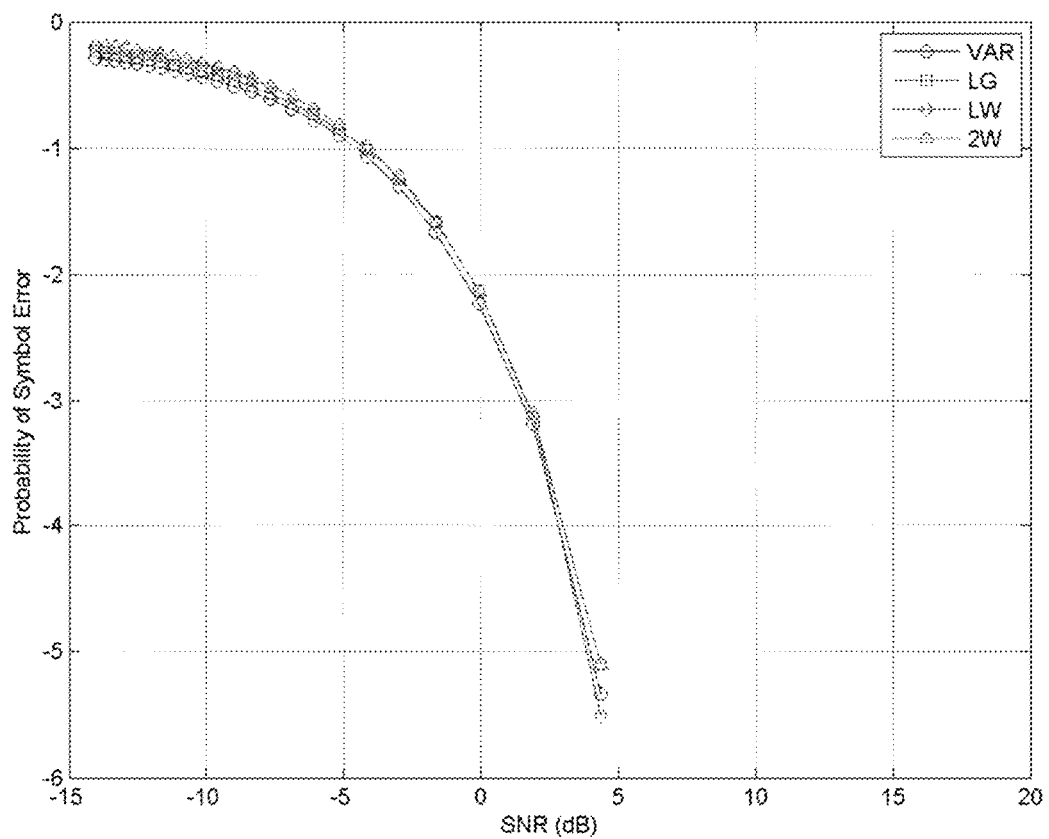
FIG. 4 is a chart describing symbol error rate performance at a cutoff value of 2.1213, in accordance with embodiments of the present disclosure.

FIG. 4 contains symbol error rates for the VAR compander and other current high-performing companders, including: Lagrange (LG), linear Wang (LW), and two-piece linear Wang (2W) companders. FIG. 3 shows the VAR compander provides improved symbol error rate performance over these state of the art companders. More specifically, the VAR compander provides about one tenth of a dB improvement in SER performance over the LG compander.

Figure 5:
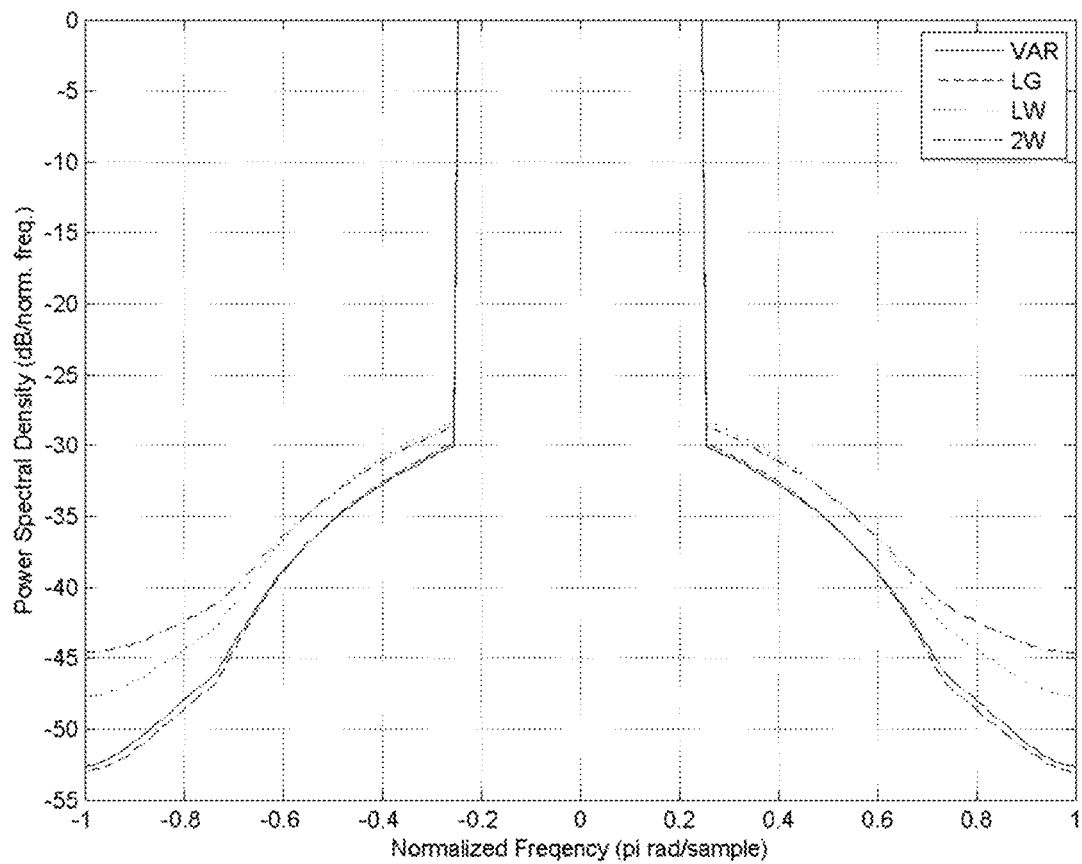
FIG. 5 is a chart describing power spectrums at a cutoff value of 2.1213, in accordance with embodiments of the present disclosure.

FIG. 5 contains the power spectrums for the four companders. FIG. 4 shows that the VAR compander provides out-of-band power rejection performance that is improved over the best-performing LG compander, with the VAR compander providing approximately two tenths of a dB improvement over the LG compander.

Figure 6:
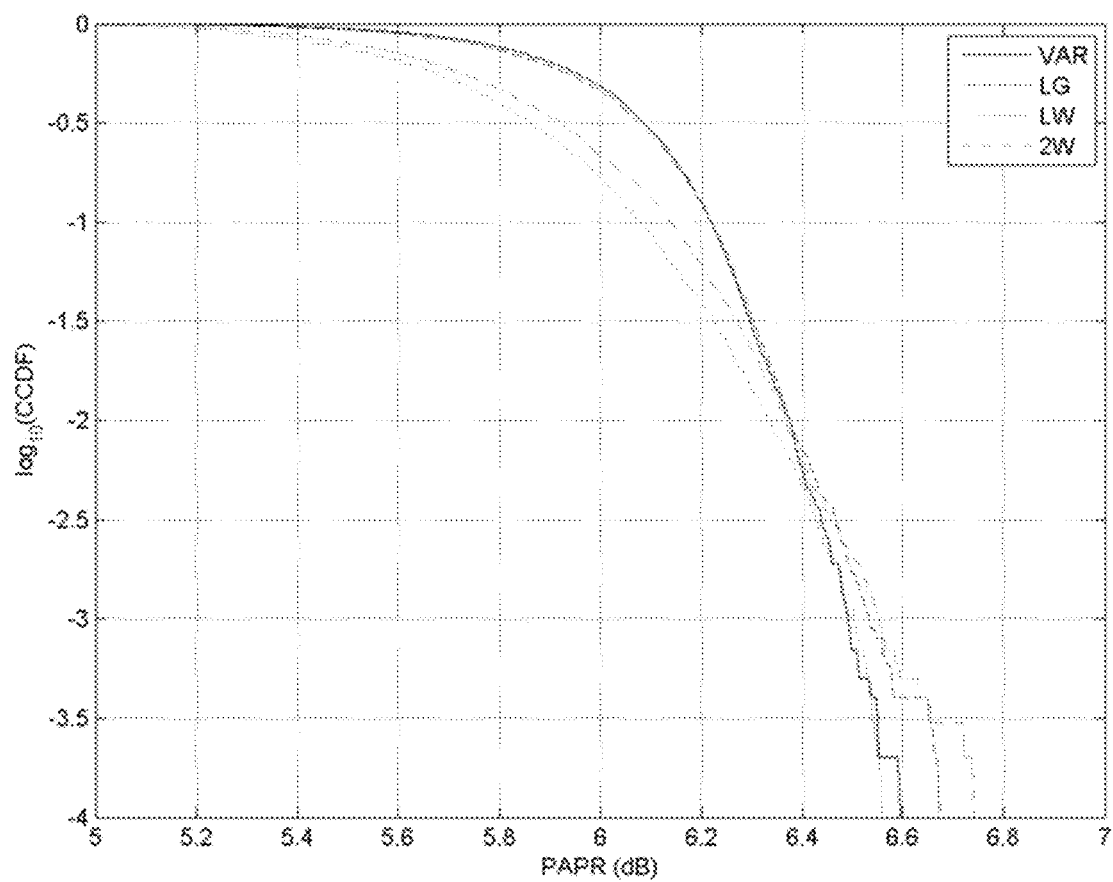
FIG. 6 is a chart describing PAPR reduction performance at a cutoff value of 2.1213, in accordance with embodiments of the present disclosure.

FIG. 6 describes the PAPR reduction performance for the four companders discussed above. FIG. 6 shows that the VAR compander provides performance, that while less than the LW and 2 W companders, matches the performance of the LG compander.

Figure 7:
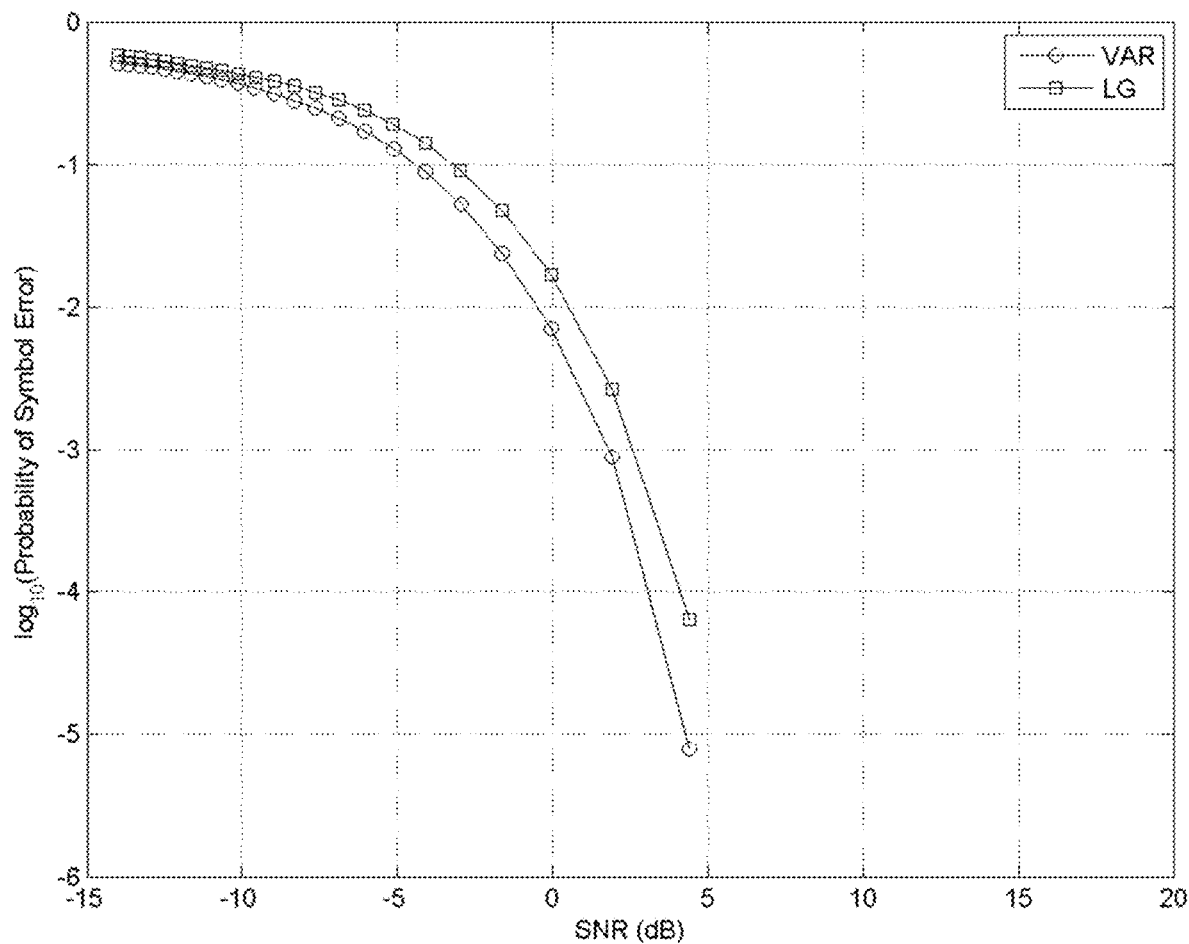
FIG. 7 is a chart describing symbol error rate performance at a cutoff value of 1.8, in accordance with embodiments of the present disclosure.

For the smaller cutoff value, A=1.8, the Variational compander provides a significant performance improvement over the state-of-the-art LG compander. FIG. 7 presents the SER performance for the VAR and LG companders, showing a significant improvement in SER performance provided by the VAR compander. At a value of $\log_{10}$ SER=-4, the VAR compander provides an improvement of over 1.0 dB in SNR performance.

Figure 8:
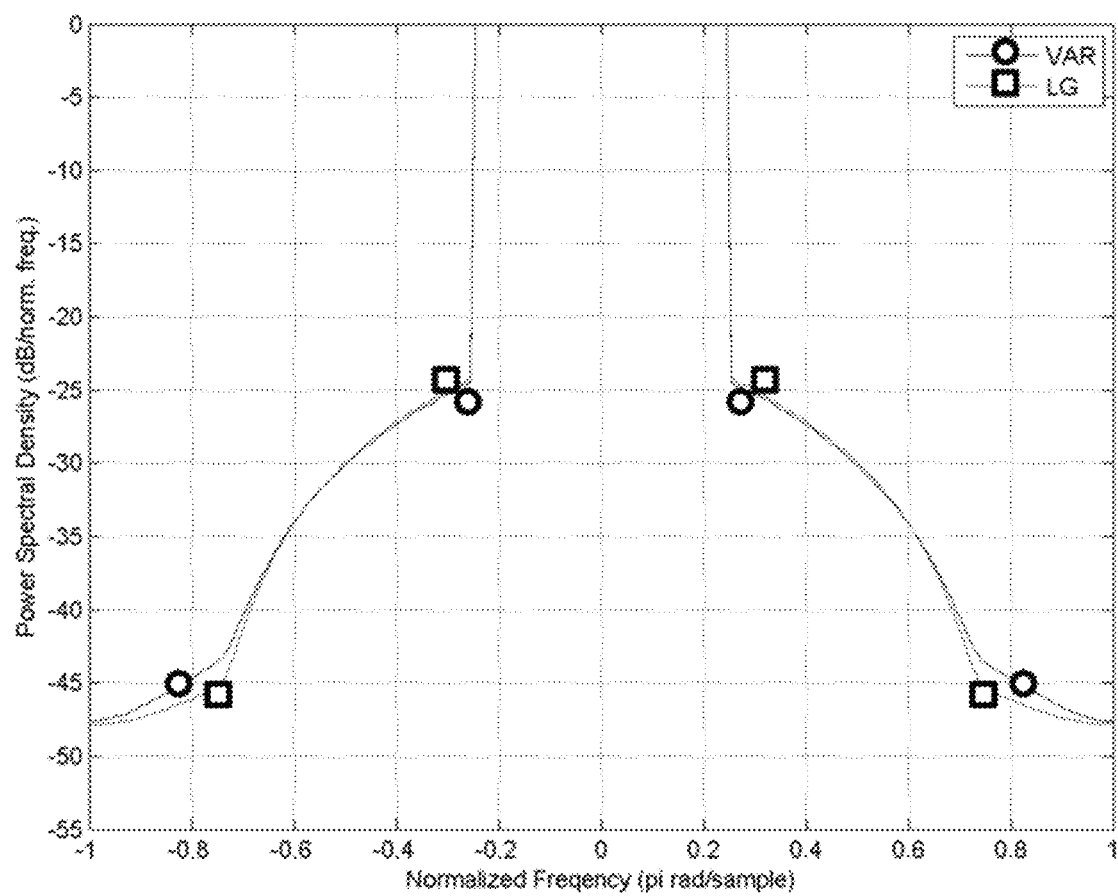
FIG. 8 is a chart describing power spectrums at a cutoff value of 1.8, in accordance with embodiments of the present disclosure.

FIG. 8 compares the power spectrums of VAR and LG companders. FIG. 8 shows that the VAR compander provides an out-of-band power rejection performance improvement of 0.4 dB at the channel edges over the LG compander.

Figure 9:
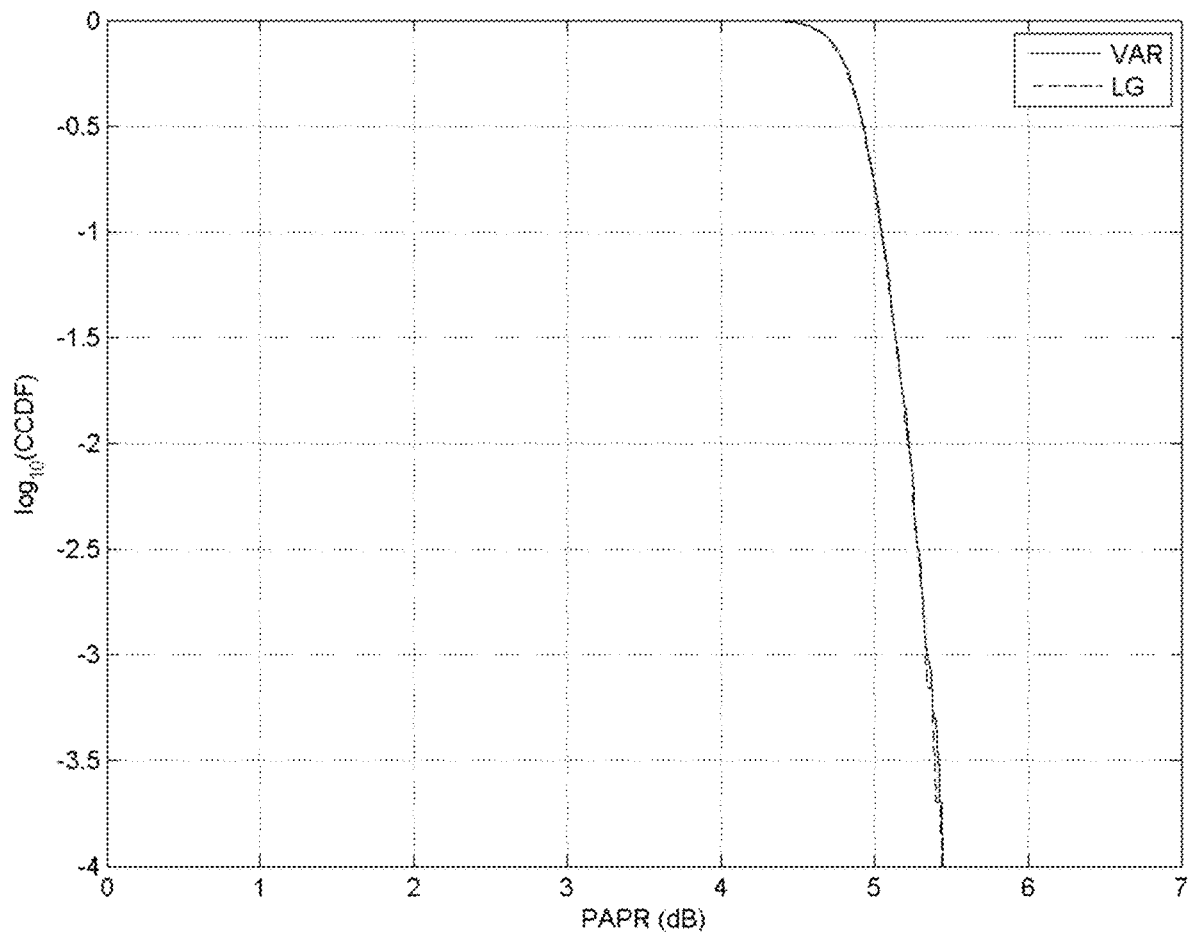
FIG. 9 is a chart describing PAPR reduction performance at a cutoff value of 1.8, in accordance with embodiments of the present disclosure.

Lastly, FIG. 9 describes the PAPR reduction performance of the VAR and LG companders. FIG. 9 shows that the PAPR reduction performance for the two companders is approximately equal.

Based on the foregoing, the VAR compander provides a significant improvement in SER performance over the current state-of-the-art LG compander at lower cutoff values while simultaneously providing a small performance improvement in out-of-band-power rejection and matching the LG compander's PAPR reduction performance.

In summary, this disclosure presents a constrained variational approach to designing companders. It has been shown that, by more stringently matching the Rayleigh distribution of the original signal, in embodiments through the inclusion of a smoothness condition, higher-performing companders are produced.

Numerical simulation results, presented herein, demonstrate that the VAR compander provides performance improvements over current state-of-the-art companders. In particular, the VAR compander provides improved demodulation performance, compared to the current state-of-the-art LG compander while providing marginally improved out-of-band power rejection and matching PAPR reduction performance.

For the avoidance of confusion, regarding the variables used herein: "σ" represents the square root of the mean power of the Rayleigh probability density function; "A" represents the signal amplitude cutoff value, that is, the maximum allowable amplitude value of the companded signal; "$A_{SAT}$" represents the saturation amplitude value in the power amplifier model; "p" represents the degree of nonlinearity in the power amplifier model; "a" represents the amplitude gain of the power amplifier model; "$y_{|OUT|}$" represents the signal output from the power amplifier model; "$y_{|IN|}$" represents the signal input to the power amplifier model; "e" represents the base of the natural logarithm; "x" represents the signal amplitude value; "$\lambda_1$" represents the Lagrange multiplier used for the unity c.d.f. constraint; "$\lambda_2$" represents the Lagrange multiplier used for the constant power constraint; "D" represents the value of the initial condition of the solution to the homogenous equation in equation 23; "ξ" represents a dummy integration variable; "n" represents a signal point index value, that is, an ordinal of the data point of the digital signal; "C" represents the compander; and "$\gamma_1,\gamma_2,\delta_1,\delta_2,\xi_1,\xi_2,B_1,B_2$" represent simplification or shortcut variables, defined by equations, which are used to denote more complicated expressions and for notational simplicity.

The foregoing description of the embodiments of the disclosure has been presented for the purposes of illustration and description. It is not intended to be exhaustive or to limit the disclosure to the precise form disclosed. Many modifications and variations are possible in light of this disclosure. It is intended that the scope of the disclosure be limited not by this detailed description, but rather by the claims appended hereto.

What is claimed is:

1. A compansion device comprising
a compander configured to compress a range of amplitudes of a signal in accordance with a companding function derived using a calculus of variations approach, creating a companded signal; and
at least one transmitter in operative communication with said compander, wherein said transmitter is configured to transmit the companded signal,
wherein said companding function is derived from:

$$I(g) = \int_0^A [f_R(x) - g(x)]^2 + [f_R'(x) - g'(x)]^2 dx.$$

2. The compansion device of claim 1 further comprising a corresponding decompander in operative communication with at least one receiver configured to receive a companded signal, wherein said decompander is configured to receive and expand the companded signal in accordance with a decompanding function, wherein said decompanding function is determined numerically as an inversion of the companding function.

3. The compansion device of claim 1 wherein said compander is configured to compand orthogonal frequency division multiplexed signals.

4. The compansion device of claim 1 wherein said companding function is subject to a unity cumulative distribution function constraint.

5. The compansion device of claim 1 wherein said companding function is subject to a constant power constraint.

6. The compansion device of claim 1 wherein A denotes a signal amplitude cutoff value.

7. The compansion device of claim 4 wherein said unity cumulative distribution function constraint is:

$$\int_0^A g(x)dx = 1.$$

8. The compansion device of claim 5 wherein said unity constant power constraint is:

$$\int_0^A x^2 g(x) dx = \int_0^\infty x^2 f_R(x) dx = \sigma^2.$$

9. A method of companding, the method comprising:
deriving a companding function using a calculus of variations approach; and
programming a compander comprising a module configured to compress a range of amplitudes of a signal to compress the signal in accordance with the derived companding function;
wherein said companding function is derived from:

$$y = -\left(\frac{\lambda_2}{2}\right)x^2 - \left(\lambda_2 + \frac{\lambda_1}{2}\right) + \frac{2x}{\sigma^2}e^{-\frac{x^2}{\sigma^2}} + De^{-x};$$

and wherein said companding function is further derived from:

$$I(g) = \int_0^A [f_R(x) - g(x)]^2 + [f_R'(x) - g'(x)]^2 dx.$$

10. The method of companding of claim 9 further comprising a method of decompanding, wherein said method of decompanding comprises programming a decompander comprising a module configured to expand a range of amplitudes of a signal to expand the signal in accordance with a derived decompanding function, wherein said decompanding function is determined numerically as an inversion of said companding function.

11. The method of companding of claim 9, wherein said compander is configured to compand orthogonal frequency division multiplexed signals.

12. The method of companding of claim 9 wherein said companding function is subject to a unity cumulative distribution function constraint.

13. The method of companding of claim 9 wherein said companding function is subject to a constant power constraint.

14. The method of companding of claim 9 wherein A denotes a signal amplitude cutoff value.

15. The method of companding of claim 12 wherein said unity cumulative distribution function constraint is $$\int_0^A g(x) dx = 1.$$

16. The method of companding of claim 13 wherein said unity constant power constraint is $$\int_0^A x^2 g(x) dx = \int_0^\infty x^2 f_R(x) dx = \sigma^2.$$

17. A compansion system comprising:
a companding processor, wherein the companding processor is configured to compands input signals into companded signals in accordance with a companding function;
a transmitter in operative communication with said companding processor, wherein said transmitter is configured to transmit the companded signals as electromagnetic wave signals through a transmitting antenna;
a receiver comprising a receiving antenna configured to receive the electromagnetic wave signals representing the companded signals; and
a decompanding processor in operative communication with said receiver, wherein the companding processor is configured to compands input signals into companded signals in accordance with a decompanding function,
wherein said companding function is derived from:

$$I(g) = \int_0^A [f_R(x) - g(x)]^2 + [f_R'(x) - g'(x)]^2 dx,$$

and
wherein said decompanding function is determined numerically as an inversion of the companding function.

* * * * *